(12) United States Patent
Armacost et al.

(10) Patent No.: US 6,656,375 B1
(45) Date of Patent: Dec. 2, 2003

(54) SELECTIVE NITRIDE: OXIDE ANISOTROPIC ETCH PROCESS

(75) Inventors: Michael D. Armacost, Wallkill, NY (US); David M. Dobuzinsky, Hopewell Junction, NY (US); John C. Malinowski, Jericho, VT (US); Hung Y. Ng, New Milford, NJ (US); Richard S. Wise, Beacon, NY (US); Chienfan Yu, Highland Mills, NY (US)

(73) Assignee: International Business Machines Corporation, Armonk, NY (US)

( * ) Notice: Subject to any disclaimer, the term of this patent is extended or adjusted under 35 U.S.C. 154(b) by 649 days.

(21) Appl. No.: 09/014,806

(22) Filed: Jan. 28, 1998

(51) Int. Cl.[7] .................................................. C23F 1/00

(52) U.S. Cl. .......................................... 216/67; 216/79

(58) Field of Search ................................. 156/33.1, 744

(56) References Cited

U.S. PATENT DOCUMENTS

| | | |
|---|---|---|
| 4,529,476 A | 7/1985 | Kawamoto et al. |
| 4,654,114 A | 3/1987 | Kadomura |
| 4,920,065 A | 4/1990 | Chin et al. |
| 5,399,237 A | 3/1995 | Keswick et al. |

FOREIGN PATENT DOCUMENTS

JP   60-115232   6/1985

*Primary Examiner*—Curtis E. Sherrer
(74) *Attorney, Agent, or Firm*—RatnerPrestia; Steven Capella, Esq.

(57) ABSTRACT

An anisotropic etching process for a nitride layer of a substrate, the process comprising using an etchant gas which comprises a hydrogen-rich fluorohydrocarbon, an oxidant and a carbon source. The hydrogen-rich fluorohydrocarbon is preferably one of $CH_3F$ or $CH_2F_2$, the carbon source is preferably one of $CO_2$ or CO, and the oxidant is preferably $O_2$. The fluorohydrocarbon is preferably present in the gas at approximately 7%–35% by volume, the oxidant is preferably present in the gas at approximately 1%–35% by volume, and the carbon source is preferably present in the gas at approximately 30%–92%.

15 Claims, 2 Drawing Sheets

SELECTIVE NITRIDE: OXIDE ANISOTROPIC ETCH PROCESS

FIELD OF THE INVENTION

The present invention relates to anisotropic etching of nitride layers. More particularly, the invention relates to an anisotropic etching process in which the etching gas uses three components, namely, $CH_3F$, $CO_2$ and $O_2$.

BACKGROUND OF THE INVENTION

Conventional dry etching processes for etching silicon nitride ($Si_3N_4$) films formed on silicon oxide ($SiO_2$) films use a variety of etchant gases. The choice of etchant gas is somewhat limited, however, due to the miniturization of semiconductor devices which contain extremely thin nitride layers. Because these nitride layers have thicknesses on the order of $10^2$–$10^3$ Å, selectivity and control of etch rates are of great importance to maintaining control of etching processes.

In microelectronic fabrication processes, etching is the selective removal of sections or regions of material from either a silicon substrate or from other thin films on the substrate surface. Etching proceeds in all directions at the same rate in an isotropic etching process. Typically, mask layers are used to protect those regions of material which the fabricator wishes to maintain on the substrate or thin film. Generally, however, mask layers cannot exactly form the pattern desired. This inability results because, as the etching proceeds, some removal occurs in undesired places. FIG. 1 shows such an occurrence.

Referring now to the drawing, wherein like reference numerals refer to like elements throughout, FIG. 1 illustrates the results of an isotropic etching process in which some material has been removed in directions other than just the z-direction—despite the presence of a mask layer 100. Mask layer 100 was placed upon an insulator film layer 110 which is on top of substrate 120. During the etching process, however, mask layer 100 did not prevent some of insulator film layer 110 from being removed in areas 130 other than directly below the mask layer 100. Similarly, some parts of insulator film layer 110 remained in areas where etching was supposed to remove it.

FIG. 2 illustrates an anisotropic etching process, in which the insulator film layer 110 has been removed in all but exactly where mask layer 100 was placed. Thus, both the mask layer 100 and the insulator film layer 110 have exactly the same dimensions in the x-y plane. In such a case, where etching occurs in only one direction (here, only in the z-direction), the etching process is said to be completely anisotropic. Because the completely anisotropic process as depicted in FIG. 2 is only an ideal state (completely single dimensional etching is not achievable), anisotropic processes are those which achieve nearly "completely anisotropic" results.

Current typical anisotropic processing techniques for thin nitride layers (e.g., spacer or liner levels of 100–1,000 Å) include the use of chlorinated-type gases (such as $HBr/Cl_2$) to provide selectivity to underlying thin oxide layers. Although very high etch rates and high selectivity may be achieved, these processes offer no selectivity to underlying silicon layers (especially doped silicon layers, such as those used in Direct Random Access Memory (DRAM) processing). In particular, in many applications, such silicon or doped silicon underlying layers are rapidly eroded by chlorine in the event of oxide punch-through.

In an attempt to overcome the above problems, technologies requiring a very thin gate oxide (less than 100 Å) have used a fluorine-based chemistry (e.g., $CHF_3$ and $CO_2$) to provide some measure of selectivity to silicon. Fluorine-based processes offer much improved selectivity to underlying silicon. Unfortunately, however, fluorine-based chemistries offer much lower nitride:oxide selectivity, typically 3:1 or less compared with 8:1 or better for the chlorine process. Fluorine-based chemistries are also generally associated with low etch rates.

Because of low uniformity of these slow, selective processes, punch-through of the oxide is a serious concern. An alternative process, using a hydrofluorocarbon (e.g., $CH_3F$ and $O_2$) having a low fluorine:carbon (F:C) ratio, has been used to enhance the selectivity of the fluorinated processes. Although more selective (approximately 6:1 ratio of nitride:oxide) than the fluorinated process, the etch rate of this process is much lower, at approximately 180 Åmin$^{-1}$. Because of its low etch rate, the time to conduct the process will be substantially increased from the chlorinated process (by a factor of about 3).

Therefore, there remains a need for a process which accelerates the etch rate, improves the selectivity of current fluorine-based processes, and offers sufficient tunability/control for optimization for both thick and thin nitride layers. Accordingly, one object of the present invention is to provide a highly selective nitride:oxide anisotropic etch process for etching the nitride layer on top of an oxide layer.

SUMMARY OF THE INVENTION

To meet this and other needs, and in view of its purposes, the present invention provides a highly selective etching process for a nitride:oxide combination upon a substrate. The process comprises the combined use of a hydrogen-rich fluorohydrocarbon (e.g., $CH_3F$ or $CH_2F_2$), a strong oxidant ($O_2$), and a carbon source ($CO_2$ or $CO$). It is preferred that the following amounts of each source be used for optimal performance: 7%–35% $CH_3F$; 1%–35% $O_2$; and 30%–92% $CO_2$ by volume.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not necessarily to scale. On the contrary, the dimensions of the various features are arbitrarily expanded or reduced for clarity. Included in the drawing are the following figures.

DETAILED DESCRIPTION OF THE INVENTION

The present invention provides a highly selective nitride:oxide anisotropic etch process which comprises the combined use of a hydrogen-rich fluorohydrocarbon such as $CH_3F$ or $CH_2F_2$, a strong oxidant like $O_2$, and a carbon source such as $CO_2$ or $CO$. It is preferred that the following amounts of each source be used for optimal performance: 7%–35% $CH_3F$; 1%–35% $O_2$; and 30%–92% $CO_2$ by volume. The present invention is particularly suited to nitride spacer and liner etch processes used for both DRAM and Logic Programs. Generally, however, the process can be extended to any capacitively coupled plasma source.

An important embodiment of the invention is the incorporation of an additional, third source of carbon (in the present case, $CO_2$) This additional carbon source increases the etch rate and selectivity of the $CH_3F/O_2$ process. By employing a combination of these three components ($CH_3F/CO_2/O_2$), the process can be tuned into a regime with high selectivity (10:1 ratio of nitride:oxide), comparatively high etch rate (500 Å $min^{-1}$, matching the chlorinated process), and comparatively good blanket uniformity (5% 1-sigma). All three plasma constituents, in the concentrations stated above, are required to meet these metrics. By enabling the etch rate and selectivity to match the chlorinated process, the process of the present invention can be implemented without fear of field oxide erosion or significant increase of process time. The selectivity to polysilicon is better than 9:1.

Figure 1:
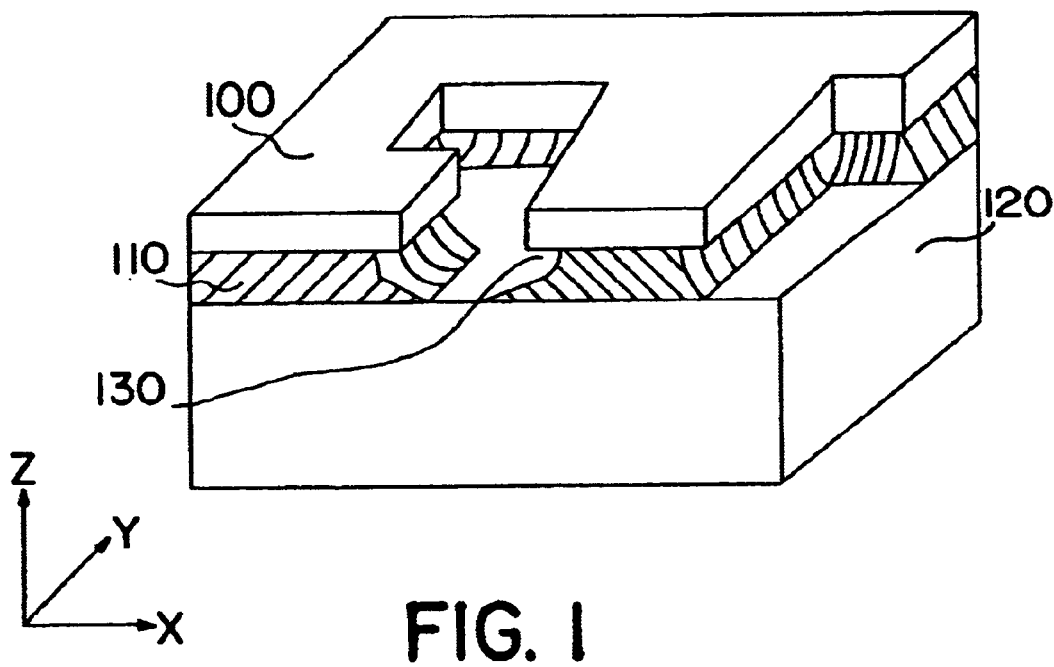
FIG. 1 illustrates typical results of an isotropic etching process.
Figure 2:
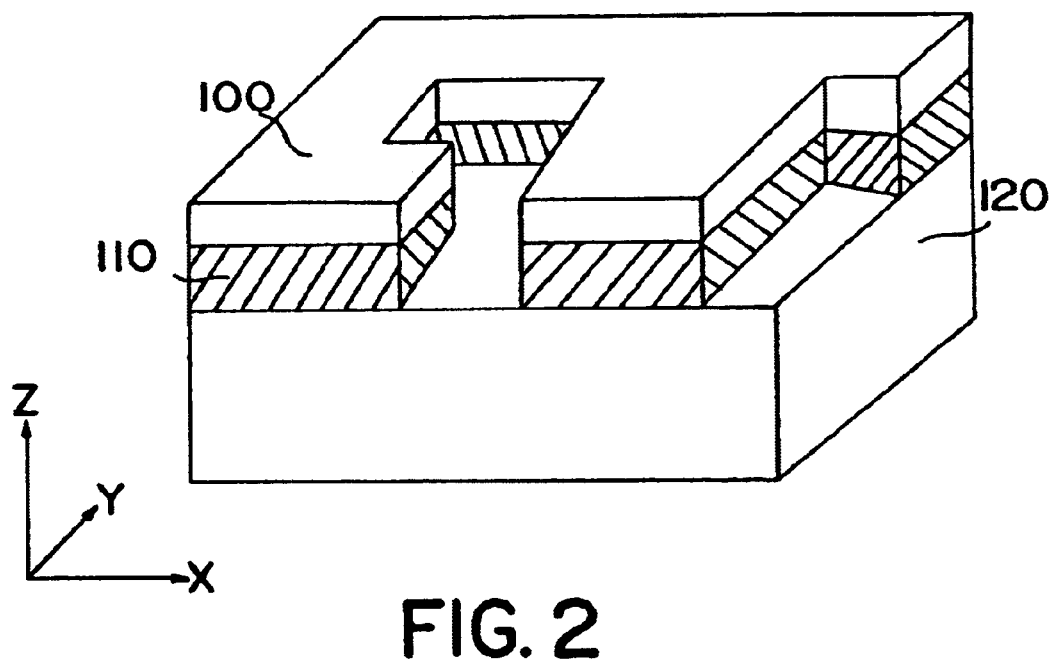
FIG. 2 illustrates results of an ideal anisotropic etching process.
Figure 3:
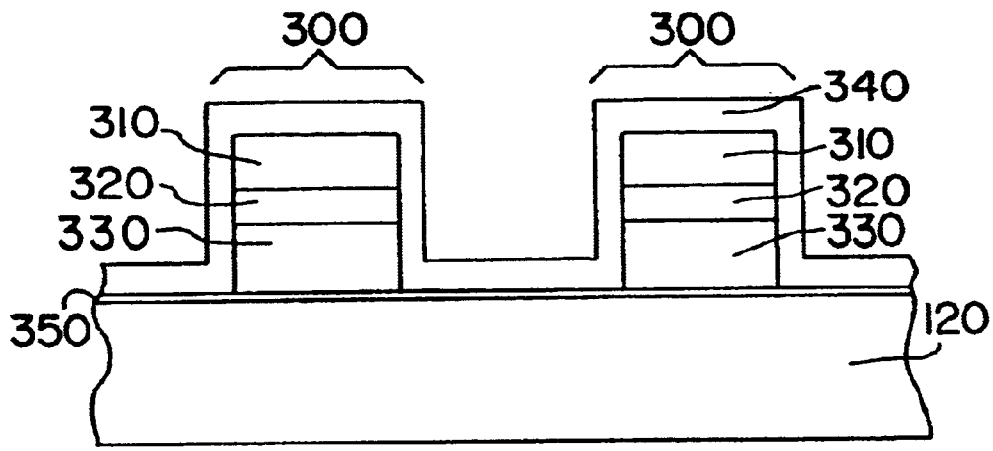
FIG. 3 illustrates the configuration of a substrate and two gate structures before the etching process of the present invention.

FIG. 3 illustrates a pre-etch configuration upon substrate 120. Two gate structures 300 are shown atop substrate 120. Each gate structure 300 is comprised of three layers. Nitride layer 310 is the uppermost layer of the gate structure 300, the middle layer is a tungsten silicide layer 320, and the bottom layer is a polysilicone layer 330. A spacer nitride layer 340 is present over both gate structures 300 and the thermal oxide layer 350. Substrate 120 underlies all of these components. Nitride layer 310 is the layer on which the etching process is focused. Etching of this nitride layer according to the present invention will yield that which is illustrated in FIG. 4.

Figure 4:
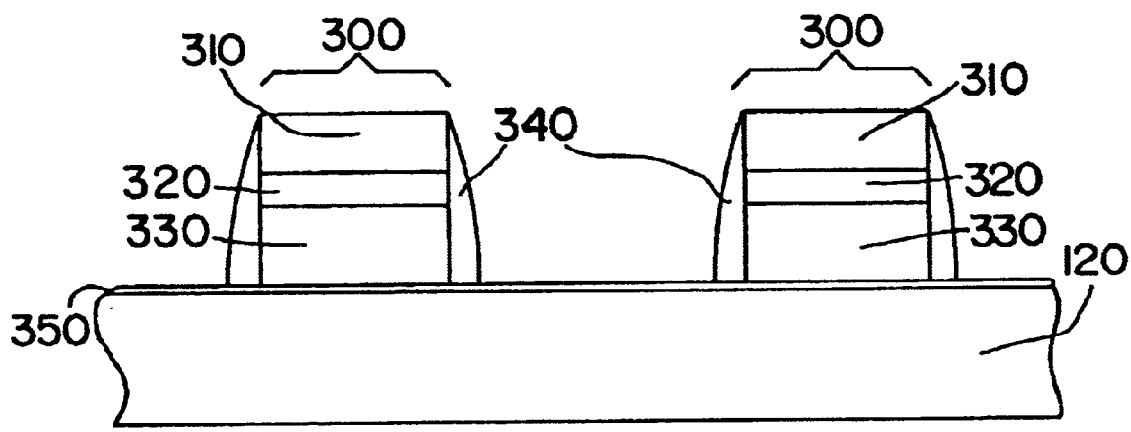
FIG. 4 illustrates the configuration of a substrate and two gate structures after the etching process of the present invention.

FIG. 4 shows the results of the etching process according to the present invention, where the spacer nitride layer 340 has been removed everywhere except the sides of each gate structure 300. Note that there is very little footing at the base of each gate structure 300. This is important because it minimizes contact resistance during self-aligned contact (SAC) etching. SAC etching is an etching process which provides an alternative to conventional contact structures, and techniques in this area are well known to those skilled in the art.

The mechanism for nitride:oxide selectivity in this chemistry is not well understood. In order to achieve the metrics for etch rate, selectivity, and uniformity, it is necessary to precisely control both the C/F ratio as well as the hydrogen content of the plasma. In the present invention, controlling the quantities of the three plasma constituent gases allows precise control of these ratios.

In an alternate embodiment, the addition of $CHF_3$ (1–10% by volume) to the plasma improves the stability of the process without causing degradation in the above metrics. This is especially important where poorly conditioned chambers are used and $CF_x$ species are more abundant.

The following examples are included to more clearly demonstrate the overall nature of the invention. These examples are exemplary, not restrictive, of the invention.

EXAMPLES

Example 1

Preliminary experiments were carried out with $CH_3F/CO_2$ on blanket wafers. The key parameters used were:

| | |
|---|---|
| $CH_3F$ = 8 sccm | $O_2$ = 0 |
| $CO_2$ = 40 sccm | Pressure = 45 mT |
| Power = 145 W | He = 26 Torr |

Using these process parameters, the key metrics were (using low pressure chemical vapor deposition (LPCVD) of the nitride and thermal oxide layers):

| | |
|---|---|
| Nitride Etch Rate = | 185 Å $min^{-1}$ |
| Selectivity to Oxide = | 3.2:1 |
| Nitride Etch Uniformity = | 5.86% |

Example 2

For a spacer etch application, the etch rate must exceed 300 Å $min^{-1}$, and the selectivity to underlying oxide must be better than 8:1. Based on the mechanism discussed in Example 1, an L4 matrix was run using power, $CH_3F$ flow, and $O_2$ flow as the key parameters. The second run of the matrix utilized the following parameters:

| | |
|---|---|
| $CH_3F$ = 12 sccm | $O_2$ = 10 sccm |
| $CO_2$ = 40 sccm | Pressure = 45 mT |
| Power = 145 W | He = 26 Torr |

Using these process parameters, the key metrics were (using LPCVD of the nitride and thermal oxide layers):

| | |
|---|---|
| Nitride Etch Rate = | 541 Å $min^{-1}$ |
| Selectivity to Oxide = | 8.1:1 |
| Nitride Etch Uniformity = | 9.53% (1 sigma) |

Example 3

Based on the results of the matrix used in Example 2, another matrix was designed using $CH_3F$ flow (at 9 to 11 sccm), power (at 80–120 W), and pressure (at 35–45 Based on the first L4 results, the $O_2$ flow rate was fixed at 10.8 sccm and the $CO_2$ flow rate was fixed at 40 sccm. The purpose of this matrix was to maximize the selectivity and uniformity of the etch by reducing the nitride etch rate. The first run used the following parameters:

| | |
|---|---|
| $CH_3F$ = 9 sccm | $O_2$ = 10.8 sccm |
| $CO_2$ = 40 sccm | Pressure = 35 mT |
| Power = 80 W | He = 26 Torr |

Using these process parameters, the key metrics were (using LPCVD of the nitride and thermal oxide layers):

| | |
|---|---|
| Nitride Etch Rate = | 301 Å $min^{-1}$ |
| Selectivity to Oxide = | 9.0:1 |
| Nitride Etch Uniformity = | 4.54% (1 sigma) |

CONCLUSION

As evidenced by these examples, the selective use of all three sources ($CH_3F/CO_2/O_2$) achieves high selectivity and reasonable uniformity while increasing the etch rate of the nitride substantially over the current state of the art.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An anisotropic etching process for a nitride layer on a substrate, the process comprising etching with an etchant gas comprised of a hydrogen-rich fluorohydrocarbon, diatomic oxygen, and a carbon source, wherein the fluorohydrocarbon is present in the gas at 7%–35% by volume, the diatomic oxygen is present in the gas at 1%–35% by volume, and the carbon source is present in the gas at 30%–92% by volume.

2. The process of claim 1 wherein the hydrogen-rich fluorohydrocarbon is one of $CH_3F$ and $CH_2F_2$.

3. The process of claim 2 wherein the carbon source is one of $CO_2$ and CO.

4. The process of claim 1 wherein the nitride layer is formed on an oxide layer.

5. The process of claim 4 wherein the nitride layer comprises silicon nitride.

6. The process of claim 5 wherein the oxide layer comprises silicon oxide.

7. The process of claim 1 wherein the substrate comprises silicon.

8. The process of claim 1 wherein the etchant gas further comprises $CHF_3$.

9. An anisotropic etching process for a nitride layer on a substrate, the process comprising etching with an etchant gas comprising a hydrogen-rich fluorohydrocarbon, diatomic oxygen, and a carbon source, wherein the process has a nitride-to-oxide selectivity of approximately 10:1; an etch rate of approximately 500 Å $min^{-1}$; and a uniformity of approximately 5% 1 sigma, and wherein the fluorohydrocarbon is present in the gas at 7%–35% by volume, the diatomic oxygen is present in the gas at 1%–35% by volume, and the carbon source is present in the gas at 30%–92% by volume.

10. The process of claim 9 wherein the hydrogen-rich fluorohydrocarbon is one of $CH_3F$ and $CH_2F_2$.

11. The process of claim 10 wherein the carbon source is one of $CO_2$ and CO.

12. The process of claim 9 wherein the nitride layer is formed on an oxide layer.

13. The process of claim 12 wherein the nitride layer comprises silicon nitride.

14. The process of claim 12 wherein the oxide layer comprises silicon oxide.

15. The process of claim 9 wherein the etchant gas further comprises $CHF_3$.

* * * * *